United States Patent
Ikisawa et al.

(10) Patent No.: US 8,728,358 B2
(45) Date of Patent: May 20, 2014

(54) SINTERED COMPACT, AMORPHOUS FILM AND CRYSTALLINE FILM OF COMPOSITE OXIDE, AND PROCESS FOR PRODUCING THE FILMS

(75) Inventors: Masakatsu Ikisawa, Ibaraki (JP); Masataka Yahagi, Ibaraki (JP); Kozo Osada, Ibaraki (JP); Takashi Kakeno, Ibaraki (JP)

(73) Assignee: JX Nippon Mining & Metals Corporation, Tokyo (JP)

( * ) Notice: Subject to any disclaimer, the term of this patent is extended or adjusted under 35 U.S.C. 154(b) by 0 days.

(21) Appl. No.: 13/592,520

(22) Filed: Aug. 23, 2012

(65) Prior Publication Data

US 2012/0319057 A1    Dec. 20, 2012

Related U.S. Application Data

(63) Continuation of application No. 12/668,216, filed as application No. PCT/JP2008/062171 on Jul. 4, 2008, now Pat. No. 8,277,694.

(30) Foreign Application Priority Data

Jul. 13, 2007   (JP) ................................. 2007-183799

(51) Int. Cl.
*H01B 1/08* (2006.01)
*B05D 5/00* (2006.01)
*C23C 14/08* (2006.01)

(52) U.S. Cl.
USPC ............... 252/520.1; 204/192.15; 204/298.13

(58) Field of Classification Search
USPC ........... 252/520.1; 428/922, 933; 204/192.15, 204/298.13
See application file for complete search history.

(56) References Cited

U.S. PATENT DOCUMENTS

| 6,106,681 | A | 8/2000 | Saito et al. |
| 6,929,772 | B2 | 8/2005 | Yanai et al. |

(Continued)

FOREIGN PATENT DOCUMENTS

| JP | 09-110527 A | 4/1997 |
| JP | 2001-151572 A | 6/2001 |

(Continued)

OTHER PUBLICATIONS

Morikawa et al "Crystal growth of ITO films prepared by DC magnetron sputtering . . . ", This Solid Films 281-282 (1996) 202-205.*

(Continued)

*Primary Examiner* — Mark Kopec
(74) *Attorney, Agent, or Firm* — Howson & Howson LLP (57) ABSTRACT

An amorphous film comprising indium, tin, calcium and oxygen, wherein tin is contained at a ratio of 5 to 15% based on an atomicity ratio of Sn/(In+Sn+Ca) and calcium is contained at a ratio of 0.1 to 2.0% based on an atomicity ratio of Ca/(In+Sn+Ca), and remnant is indium and oxygen, is provided. The film can be crystallized by annealing at 260° C. or lower in which resistivity of the film will be 0.4 mΩcm or less. In this manner, an ITO thin film for use as a display electrode or the like in a flat panel display can be made into an amorphous ITO film by way of sputter deposition without heating the substrate or adding water during deposition. This ITO film can be crystallized by annealing at a low temperature and will have low resistivity. Methods of producing such films and sintered compacts are provided.

3 Claims, 2 Drawing Sheets

(56) References Cited

U.S. PATENT DOCUMENTS

| | | |
|---|---|---|
| 7,008,519 B2 | 3/2006 | Takahashi et al. |
| 7,504,351 B2 | 3/2009 | Kurihara |
| 2008/0173962 A1* | 7/2008 | Jeong et al. .................. 257/429 |
| 2008/0197344 A1* | 8/2008 | Yano et al. ..................... 257/40 |
| 2009/0085014 A1 | 4/2009 | Ikisawa et al. |
| 2009/0120786 A1 | 5/2009 | Osada |
| 2009/0200525 A1 | 8/2009 | Ikisawa et al. |
| 2009/0206303 A1 | 8/2009 | Osada |
| 2009/0250669 A1 | 10/2009 | Osada |
| 2010/0189636 A1 | 7/2010 | Ikisawa et al. |
| 2012/0043509 A1 | 2/2012 | Takami et al. |

FOREIGN PATENT DOCUMENTS

| | | |
|---|---|---|
| JP | 2003-055759 A | 2/2003 |
| JP | 2003-105532 A | 4/2003 |
| JP | 2003-160861 A | 6/2003 |
| JP | 3632524 A | 3/2005 |
| JP | 2005-194594 A | 7/2005 |
| JP | 2005-259497 A | 9/2005 |
| JP | 3827334 A | 9/2006 |

OTHER PUBLICATIONS

Morikawa et al "Crystallization and decrease in resistivity on heat treatment of amorphous indium tin oxide . . . ", Thin Solid Films 339 (1999) 3090313.*

Hu et al "Effects of heat treatment on properties of ITO films . . . ", Vacuum 75 (2004) 183-188.*

* cited by examiner

SINTERED COMPACT, AMORPHOUS FILM AND CRYSTALLINE FILM OF COMPOSITE OXIDE, AND PROCESS FOR PRODUCING THE FILMS

CROSS REFERENCE TO RELATED APPLICATIONS

This application is a continuation of U.S. application Ser. No. 12/668,216 (now issued as U.S. Pat. No. 8,277,694 B2) which is the National Stage submitted on Jan. 8, 2010 of International Application No. PCT/JP2008/062171, filed Jul. 4, 2008, which claims the benefit under 35 USC 119 of Japanese Application No. 2007-183799, filed Jul. 13, 2007.

BACKGROUND

The present invention relates to a crystalline film of composite oxide and its production method and an amorphous film of composite oxide and its production method which are to be used as an electrode in a flat panel display or the like, as well as to a sintered compact of composite oxide to be used in producing the foregoing oxide films.

An ITO (Indium Tin Oxide) film is characterized in low resistivity and high transmission factor, and can be micro-fabricated easily. Since these characteristics are superior in comparison to other transparent conductive films, an ITO film is being broadly used in various fields including for use as a display electrode in a flat panel display. The deposition method of the ITO film in today's industrial production process is mostly based on the so-called sputter deposition method of performing sputtering using an ITO sintered compact as the target since the ITO film can be uniformly formed on a large area with favorable productivity.

In a flat panel display manufacturing process using an ITO transparent conductive film, the crystallinity of the ITO film immediately after the sputtering is amorphous, and, in most cases, micro-fabrication such as etching is performed with the ITO film in an amorphous state, and thermal annealing is subsequently performed to crystallize the ITO film. This is because an ITO amorphous film is advantageous in terms of productivity in a large etching rate, and the ITO crystal film is superior in low resistivity and in heat resistance, and both advantages can thereby be enjoyed.

Although most of the film obtained by sputtering the ITO target is amorphous, in many cases a part of the film becomes crystallized. The reason for this is that some particles that adhere to the substrate due to sputtering have a high energy level, the temperature of the film becomes so high as to exceed the crystallization temperature due to the transfer of energy after the particles adhere to the substrate, and a part of the film consequently becomes crystallized, although the crystallization temperature of the ITO film is approximately 150° C. and most of the film is amorphous since it will be lower than 150° C.

If a part of the ITO film becomes crystallized as described above, such crystallized portion will remain as so-called etching residue in the subsequent etching process, and cause problems such as a short circuit, since the etching rate of that part will be lower than that of an amorphous portion by roughly two orders of magnitude.

In light of the above, it is known that the addition of water ($H_2O$) in addition to sputter gas such as argon in a chamber during sputtering is effective as a method of preventing the crystallization of the sputtered film and amorphizing the entire sputtered film (for example, refer to Thin Solid Films 445 (2003) p 235 to 240).

Nevertheless, the method of attempting to obtain an amorphous film by sputtering upon adding water entails numerous problems. Foremost, in many cases particles are generated on the sputtered film. These particles have an adverse effect on the flatness and crystallinity of the sputtered film. Since particles will not be generated if water is not added, the problem of generation of particles is caused by adding water.

In addition, even if the water concentration in the sputtering chamber is initially an adequate water concentration, the concentration will gradually fall below the adequate concentration, and a part of the sputtered film will become crystallized, since it gradually decreases pursuant to the lapse of the sputtering time.

On the other hand, however, if the concentration of the water to be added is increased in order to reliably obtain an amorphous sputtered film, the crystallization temperature upon crystallizing the film in the subsequent annealing process will become extremely high, which is a problem in that the resistivity of the obtained film will become extremely high.

In other words, if sputtering is performed upon adding water to amorphize the entire sputtered film, it is necessary to constantly monitor and control the water concentration within the chamber; however, this is extremely difficult and requires considerable time and effort.

In order to overcome the foregoing problems, a transparent conductive material as a stable amorphous material is sometimes used in substitute for an ITO film in which a crystalline film can be easily formed. For instance, with a sintered compact having a composition of adding zinc to indium oxide as the target, it is known that such a target can be sputtered to obtain an amorphous film, but the sputtered film obtained as described above is an extremely stable amorphous material and will not crystallize unless it is subject to a high temperature of 500° C. or higher.

Thus, it is not possible to attain the advantages in the production process of crystallizing the film and incomparably reducing the etching rate, and the resistivity of the sputtered film will be approximately 0.45 Ωcm, which is higher than the crystallized ITO film. Moreover, the visible light average transmission factor of this film is roughly 85%, and is inferior to an ITO film.

Also, the following patent documents and the like that are similar to the present invention in certain respects as a matter of form but different in terms of configuration and technical concept, and the outline thereof is explained below.

JP Patent Laid-Open Publication No. 2003-105532 and JP Patent Laid-Open Publication No. 2004-149883 describe a sputtering target for forming a transparent conductive film with high resistivity by adding insulating oxide to ITO, and calcium oxide, magnesium oxide and the like are listed as examples of the insulating oxide; however, the Examples provide a description regarding only silicon oxide. The object of these Patent Documents is only to obtain a high resistivity film, and does not contain any perspective based on the technical concept on the crystallinity of the film during deposition or the crystallization of the film based on the subsequent annealing process.

As described above, the conventional technology which uses a sintered compact having a composition of adding zinc to indium oxide as the target is insufficient as a solution since it has drawbacks such as the film resistivity being high.

Moreover, the patent documents and the like that are similar to the present invention in certain respects as a matter of form such as including descriptions of adding calcium to ITO do not give consideration to the problems that are indicated by the present invention, and simply aim to achieve the high resistivity of the film by adding calcium and the like. Thus, the foregoing patent documents and the like do not include the technical concept of controlling the crystallinity of the film or leveraging the low resistivity of the crystallized film as with the present invention.

In addition, if the effect of high resistivity is to be sought based on the concentration of the added calcium and the like, the additive amount is too high, and there are no descriptions on favorable film characteristics of the present invention or descriptions in the Examples regarding the production method and the like.

SUMMARY

Thus, an object of the present invention is to provide an ITO thin film, its production method, and a sintered compact for producing such a film for use as a display electrode or the like in a flat panel display which can be made into an amorphous ITO film by way of sputter deposition without heating the substrate or adding water during deposition. With this sputtered film, a part of the crystallized film will not remain as residue during the etching process, and superior etching properties are yielded by etching at a relatively fast etching rate and the like. In addition, this sputtered film can be crystallized by annealing at a temperature that is not too high, and the resistivity after crystallization is sufficiently low.

As a result of intense study regarding an oxide target obtained by adding various elements to ITO, the present inventors discovered that the foregoing problems can be overcome by sputtering a sintered compact obtained by adding an adequate concentration of calcium or calcium and magnesium to ITO under prescribed conditions, and annealing the obtained sputtered film under prescribed conditions, and thereby achieved the present invention.

Specifically, the present invention provides a sintered compact of composite oxide substantially comprised of indium, tin, calcium and oxygen, wherein tin is contained at a ratio of 5 to 15% based on an atomicity ratio of $Sn/(In+Sn+Ca)$ and calcium is contained at a ratio of 0.1 to 2.0% based on an atomicity ratio of $Ca/(In+Sn+Ca)$, and remnant is indium and oxygen.

The present invention additionally provides the sintered compact of composite oxide described above having resistivity of 0.2 mΩcm or less.

The present invention further provides a method of producing an amorphous film of composite oxide, wherein the sintered compact of composite oxide as described above is sputtered to produce an amorphous film having the same composition. In forming an amorphous film of composite oxide for a transparent conductive film, an extremely efficient method is to produce a sintered compact having the same component composition as the amorphous film of composite oxide for use in sputtering.

The present invention additionally provides an amorphous film of composite oxide substantially comprised of indium, tin, calcium and oxygen, wherein tin is contained at a ratio of 5 to 15% based on an atomicity ratio of $Sn/(In+Sn+Ca)$ and calcium is contained at a ratio of 0.1 to 2.0% based on an atomicity ratio of $Ca/(In+Sn+Ca)$, and remnant is indium and oxygen.

The present invention further provides a method of producing a crystalline film of composite oxide, wherein after producing an amorphous film of composite oxide substantially comprised of indium, tin, calcium and oxygen in that tin is contained at a ratio of 5 to 15% based on an atomicity ratio of $Sn/(In+Sn+Ca)$ and calcium is contained at a ratio of 0.1 to 2.0% based on an atomicity ratio of $Ca/(In+Sn+Ca)$, and remnant is indium and oxygen, the film is crystallized by annealing at a temperature of 260° C. or lower.

With the present invention, the amorphous film of composite oxide formed on a substrate can be easily transformed into a crystalline film of composite oxide by annealing at a relatively low temperature. This is one of the significant features of the present invention.

The present invention additionally provides a crystalline film of composite oxide substantially comprised of indium, tin, calcium and oxygen, wherein tin is contained at a ratio of 5 to 15% based on an atomicity ratio of $Sn/(In+Sn+Ca)$ and calcium is contained at a ratio of 0.1 to 2.0% based on an atomicity ratio of $Ca/(In+Sn+Ca)$, and remnant is indium and oxygen.

With the present invention, calcium is added as an essential component in the ITO composite oxide film. The inclusion of calcium plays an important role in the amorphization of the ITO composite oxide film.

The present invention further provides the crystalline film of composite oxide as described above, wherein resistivity of the film is 0.4 mΩcm or less.

This crystalline film of composite oxide has the same composition as the amorphous film of composite oxide described above, but a film having considerably lower resistivity can be formed.

The present invention additionally provides a sintered compact of composite oxide substantially comprised of indium, tin, calcium, magnesium and oxygen, wherein tin is contained at a ratio of 5 to 15% based on an atomicity ratio of $Sn/(In+Sn+Ca+Mg)$ and a total amount of calcium and magnesium is contained at a ratio of 0.1 to 2.0% based on an atomicity ratio of $(Ca+Mg)/(In+Sn+Ca+Mg)$, and remnant is indium and oxygen.

The present invention further provides a sintered compact of composite oxide according as described above, wherein resistivity of the sintered compact is 0.2 mΩcm or less.

The present invention additionally provides a method of producing an amorphous film of composite oxide, wherein the sintered compact of composite oxide described above is sputtered to produce an amorphous film having the same composition.

In forming an amorphous film of composite oxide for a transparent conductive film, an extremely efficient method is to produce a sintered compact having the same component composition as the amorphous film of composite oxide for sputtering.

The present invention further provides an amorphous film of composite oxide substantially comprised of indium, tin, calcium, magnesium and oxygen, wherein tin is contained at a ratio of 5 to 15% based on an atomicity ratio of $Sn/(In+Sn+Ca+Mg)$ and a total amount of calcium and magnesium is contained at a ratio of 0.1 to 2.0% based on an atomicity ratio of $(Ca+Mg)/(In+Sn+Ca+Mg)$, and remnant is indium and oxygen.

The present invention additionally provides a method of producing a crystalline film of composite oxide, wherein after producing an amorphous film of composite oxide substantially comprised of indium, tin, calcium, magnesium and oxygen in which tin is contained at a ratio of 5 to 15% based on an atomicity ratio of $Sn/(In+Sn+Ca+Mg)$ and a total amount of calcium and magnesium is contained at a ratio of 0.1 to 2.0% based on an atomicity ratio of $(Ca+Mg)/(In+Sn+Ca+Mg)$, and remnant is indium and oxygen, the film is crystallized by annealing at a temperature of 260° C. or lower.

With the present invention, the amorphous film of composite oxide formed on a substrate can be easily transformed into a crystalline film of composite oxide by annealing at a relatively low temperature. This is one of the significant features of the present invention.

The present invention further provides a crystalline film of composite oxide substantially comprised of indium, tin, calcium, magnesium and oxygen, wherein tin is contained at a ratio of 5 to 15% based on an atomicity ratio of Sn/(In+Sn+Ca+Mg) and a total amount of calcium and magnesium is contained at a ratio of 0.1 to 2.0% based on an atomicity ratio of (Ca+Mg)/(In+Sn+Ca+Mg), and remnant is indium and oxygen.

With the present invention, calcium and magnesium are additionally contained as essential components in the ITO composite oxide film. The inclusion of calcium and magnesium plays an important role in the amorphization of the ITO composite oxide film.

The present invention additionally provides a crystalline film of composite oxide as described above, resistivity thereof being 0.4 mΩcm or less.

This crystalline film of composite oxide has the same composition as the amorphous film of composite oxide as described above, but a film having considerably lower resistivity can be formed.

The first feature of the present invention is that the added calcium and the like prevent from crystallization based on the effect of disconnecting the ITO network structure coupling. If the aim is to simply prevent the crystallization of the ITO film, such aim can be achieved by making the additive concentration to be extremely high.

Nevertheless, in the foregoing case, it is not possible to yield the second feature of the present invention of crystallizing the film by annealing at a temperature that is not too high after deposition, and achieving low resistivity of the crystallized film. This is because if the additive element concentration is set high, the resistivity of the crystallized film will also rise according to the increase of crystallization temperature.

In other words, the characteristic feature of the present invention lies in that it is possible to realize both the amorphization of the sputtering film during deposition, and achievement of crystallization and low resistivity of the film in the subsequent annealing at an adequate temperature, and the present invention has a novel technical concept that is able to overcome the foregoing problems for the first time.

According to the present invention, by using a sputtering target obtained by adding an adequate concentration of calcium and the like to ITO in sputter deposition under prescribed conditions without adding water during deposition or heating the substrate, it is possible to obtain a film which is entirely amorphous. Moreover, this film is able to enjoy the advantages of an ITO amorphous film which will not encounter any problem of etching residue in the subsequent etching process and the etching rate is faster by roughly two orders of magnitude in comparison to a crystalline ITO film. Moreover, it is able to yield an extremely superior effect of enjoying the advantage of crystallizing the film by annealing at a temperature that is not too high after deposition and attaining lower resistivity of the film.

DETAILED DESCRIPTION

The sintered compact of composite oxide, amorphous film of composite oxide, crystalline film of composite oxide, method of producing amorphous film of composite oxide, and method of producing a crystalline composite oxide film according to the present invention are now explained in further detail. The sintered compact of composite oxide of the present invention that is useful as a sintered compact of composite oxide for forming a transparent conductive film is substantially comprised of indium, tin, calcium and oxygen, wherein tin is contained at a ratio of 5 to 15% based on an atomicity ratio of Sn/(In+Sn+Ca) and calcium is contained at a ratio of 0.1 to 2.0% based on an atomicity ratio of Ca/(In+Sn+Ca), and remnant is indium and oxygen.

Here, Sn, In, and Ca represent the atomicity of tin, indium and calcium, respectively, and show the adequate concentration range of the atomicity ratio of tin and calcium in relation to the total atomicity of indium, tin and calcium as all-metal atoms, respectively.

The composition of the sputtering target for forming the transparent conductive film and the composition of the transparent conductive film are substantially the same as the composition of the oxide sintered compact for forming the transparent conductive film.

The sputtering target was obtained by simply processing the oxide sintered compact into a prescribed diameter and thickness, and the transparent conductive film is a film obtained by subjecting the sputtering target to sputter deposition. Thus, there is hardly any difference in the composition of the sputtering target and the composition of the film obtained by way of sputter deposition.

The term "substantially" as used in this specification means that, although the constituent elements of the sintered compact of composite oxide for forming the transparent conductive film are comprised only from four types of elements; namely, indium, tin, calcium, and oxygen, even if inevitable impurities contained in a commercially available raw material and which cannot be eliminated with a standard refining method during the production of such raw material are included in an inevitable concentration range, the present invention covers all aspects including the above. In other words, inevitable impurities are covered by the present invention.

When tin is added to indium oxide, it functions as an n-type donor and yields the effect of lowering the resistivity. With a commercially available ITO target and the like, the tin concentration Sn is normally Sn/(In+Sn) is roughly 10%. If the tin concentration is too low, the electron donation will be low. Contrarily, if the tin concentration is too high, this will result in electron scattered impurities. In both cases, the resistivity of the film obtained by way of sputtering will become high. Accordingly, since the adequate range of tin concentration Sn as an ITO is in a range of 5 to 15% with the formula of Sn/(In+Sn+Ca), the tin concentration in the present invention is defined.

When calcium is added to ITO, it yields the effect of preventing the crystallization of the film and amorphizing the film. If the calcium concentration Ca is Ca/(In+Sn+Ca) <0.1%, there will hardly be any effect of amorphizing the film, and a part of the sputtered film will become crystallized.

Contrarily, in case of Ca/(In+Sn+Ca)>2.0%, the annealing temperature required to crystallize the amorphous film obtained by sputtering will become a high temperature exceeding 260° C., which is unsuitable in terms of productivity since much cost, time and labor will be spent for implementing such process.

Moreover, if the calcium concentration is too high, even if the film is crystallized by annealing it at a high temperature, the resistivity of the obtained film will be high, and this will be a significant drawback from the perspective of conductivity of the transparent conductive film. Thus, the calcium concentration is desirably in the ratio of 0.1 to 2.0% based on the atom ratio of Ca/(In+Sn+Ca) as defined in the present invention. The calcium concentration was determined as described above.

Moreover, since there is the same tendency when mixing calcium and magnesium in substitute for calcium, the total concentration thereof has been determined accordingly.

The method of producing the oxide sintered compact is now explained.

In order to produce the oxide sintered compact of the present invention, foremost, indium oxide powder, tin oxide powder and calcium oxide powder as the raw materials are weighed and mixed at a prescribed ratio. Insufficient mixing will cause a high resistivity area and a low resistivity area in the produced target where calcium oxide is segregated and abnormal discharge such as arcing due to electrification in the high resistivity area will occur easily during the sputter deposition.

Thus, it is desirable to perform sufficient mixing for roughly 2 to 5 minutes at a high speed of 2000 to 4000 rotations per minute using a super mixer. Incidentally, since the raw material powder is oxide, the atmospheric gas may be air since there is no need to give special consideration in preventing the oxidation of the raw material.

At this stage, it is also effective to introduce a calcination process of retaining the raw material in an atmospheric environment at 1250 to 1350° C. for 4 to 6 hours in order to promote the raw material in becoming a solid solution. Further, the raw material may also be preliminarily calcinated as a mixed powder of indium oxide and calcium oxide or a mixed powder of tin oxide and calcium oxide.

The mixed powder is subsequently pulverized, which aims to uniformly distribute the raw material powder in the target. Raw material with a large grain size means that there is variation in the composition depending on the location. In particular, since calcium oxide is nonconductive, it will cause an abnormal discharge during the sputter deposition. Moreover, this will also lead to variation in the crystallization prevention effect yielded by calcium, and may cause the crystallization of the ITO in areas with low calcium concentration.

Accordingly, desirably pulverization is performed so that the average grain size (D50) of the raw material powder is up to 1 µm or less, preferably 0.6 µm or less. In reality, water is added to the mixed powder to obtain slurry in which the solid content is 40 to 60%, and pulverization is performed with zirconia beads having a diameter of 1 mm for roughly 1.5 to 3.0 hours.

Granulation of the mixed powder is subsequently performed. Granulation is performed to improve the fluidity of the raw material powder and to make the filling state of such raw material powder during the press molding sufficiently favorable. PVA (polyvinyl alcohol) that acts as a binder is mixed at a ratio of 100 to 200 cc per kilogram of slurry, and this is granulated under the conditions where the granulator's inlet temperature is 200 to 250° C., outlet temperature is 100 to 150° C., and disk rotation is 8000 to 10000 rpm.

Press molding is subsequently performed. Granulated powder is filled in a mold of a prescribed size to obtain a compact at a surface pressure of 700 to 900 kgf/cm$^2$. If the surface pressure is 700 kgf/cm$^2$ or less, it is not possible to obtain a compact having sufficient density, and making the surface pressure to be 900 kgf/cm$^2$ or higher is not necessary and this is undesirable since it will also require wasteful cost and energy.

Sintering is ultimately performed. The sintering temperature is 1450 to 1600° C., the retention time is 4 to 10 hours, the rate of temperature increase is 4 to 6° C./minute, and cooling is performed with furnace cooling. If the sintering temperature is lower than 1450° C., the density of the sintered compact will be insufficient, and if the sintering temperature exceeds 1600° C., it will shorten the life of the furnace heater. If the retention time is shorter than 4 hours, the reaction among the raw material powders will not advance sufficiently, and the density of the sintered compact will be insufficient. Even if the sintering time exceeds 10 hours, since the reaction is already sufficient, this is undesirable from the perspective of productivity since energy and time will be wasted.

If the rate of temperature increase is less than 4° C./minute, much time will be required in attaining a prescribed temperature. Meanwhile, if the rate of temperature increase is greater than 6° C./minute, the temperature distribution within the furnace will not rise uniformly, and there will be unevenness. The relative density of the sintered compact obtained as described above will be approximately 99.9% and the bulk resistance will be approximately 0.13 mΩm.

The method of producing the sputtering target is explained below.

As a result of performing cylindrical grinding to the outer periphery and surface grinding to the surface side of the oxide sintered compact obtained based on the foregoing manufacturing conditions, the oxide sintered compact can be processed into a size having a thickness of roughly 4 to 6 mm and a diameter to fit the sputtering device, and a sputtering target can be obtained by affixing the oxide sintered compact to a copper backing plate with a bonding metal such as indium alloy or the like.

The sputtering deposition method is explained below.

The transparent conductive film of the present invention can be obtained by using the sputtering target of the present invention to perform DC magnetron sputter deposition with an argon gas pressure of 0.4 to 0.8 Pa, spacing between the target and the substrate at 50 to 110 mm, using glass or the like as the substrate without heating the substrate, and a sputtering power of 200 to 900 W in a case where the target size is 8 inches.

If the substrate spacing is shorter than 50 mm, the kinetic energy of the particles of the constituent elements of the target that reach the substrate will become too large and cause substantial damage to the substrate, whereby the film resistivity will increase and a part of the film may become crystallized. Meanwhile, if the spacing between the target and the substrate is longer than 110 mm, the kinetic energy of the particles of the constituent elements of the target that reach the substrate will become too small, whereby a dense film cannot be formed and the resistivity will become high. The adequate range of the argon gas pressure and the sputtering power has also been defined as described above for similar reasons. Moreover, if the substrate is heated, the film tends to crystallize easily. Accordingly, the obtained film will become amorphous by adequately selecting the foregoing sputtering conditions.

The method of evaluating the characteristics of the film is now explained.

The determination of crystallinity of the transparent conductive film obtained as described above can be confirmed based on the existence of a peak shown with a crystalline film and whether there is etching residue as shown with a crystalline film in the etching of the film with oxalic acid in the X-ray diffraction measurement (XRD measurement) of the film. In other words, if there is no peak that is unique to ITO crystals and there is no etching residue in the X-ray diffraction measurement, then that film can be determined to be amorphous.

The etching method of the film using oxalic acid can be performed, for instance, by using a solution obtained by mixing oxalic acid dihydrate $(COOH)_2 \cdot 2H_2O$ and purified water at a ratio of oxalic acid:purified water=5:95 wt % as the etchant, placing in a constant temperature bath so as to maintain the liquid temperature at 40° C., and stirring the film-attached substrate. The resistivity of the film can be sought with the Hall Effect measurement.

The annealing method of the film is now explained.

In order to crystallize the amorphous film obtained as described above, for example, crystallization can be achieved by performing annealing at a temperature of 160 to 260° C. for 30 to 60 minutes under a nitrogen atmosphere, whereby the temperature and length will vary slightly depending on the additive element. The crystallization of the film can be confirmed from the peak intensity becoming extremely strong in the XRD measurement or from the etching rate in the etching of the film using oxalic acid decreasing by roughly two orders of magnitude in comparison to the amorphous film.

In addition, the crystallized film is able to realize low resistivity of $4 \times 10^{-4}$ mΩcm or lower since the electron ejection effect based on tin will be sufficient and both the carrier concentration and mobility will increase, whereby this will vary slightly depending on the additive element concentration.

EXAMPLES

The present invention is now explained in detail with reference to the Examples. These Examples are merely illustrative, and the present invention shall in no way be limited thereby. In other words, various modifications and other embodiments based on the technical spirit claimed in the claims shall be included in the present invention as a matter of course.

Example 1

Indium oxide powder, tin oxide powder and calcium oxide powder as the raw materials were weighed to achieve In:Sn:Ca=90.78:9.08:0.14% based on the atomicity ratio, and mixed with a super mixer in an atmospheric environment for 3 minutes at 3000 rotations per minute.

Subsequently, water was added to the mixed powder to obtain slurry in which the solid content is 50%, and the slurry was pulverized with zirconia beads having a diameter of 1 mm for 2 hours to achieve an average grain size (D50) of the mixed powder of 0.6 μm or less. PVA (polyvinyl alcohol) was thereafter mixed at a ratio of 125 cc per kilogram of slurry, and granulated under the conditions where the granulator's inlet temperature was 220° C., outlet temperature was 120° C., and disk rotation was 9000 rpm.

Subsequently, granulated powder was filled in a mold of a prescribed size to obtain a target having an 8-inch diameter, and pressed at a surface pressure of 780 kgf/cm$^2$ to obtain a compact. The compact was heated up to 1540° C. at a rate of temperature increase of 5° C./minute, retained for 5 hours at 1540° C., and cooled in the form of sintering using furnace cooling.

By performing cylindrical grinding to the outer periphery and surface grinding to the surface side of the oxide sintered compact obtained based on the foregoing manufacturing conditions to realize a thickness of roughly 5 mm and a diameter of 8 inches, a sputtering target was obtained by affixing the oxide sintered compact to a copper backing plate with a bonding metal such as indium alloy or the like. Upon measuring the resistivity of the sputtering target obtained as described above, the resistivity was 0.18 mΩcm.

The foregoing sputtering target was used to perform DC magnetron sputter deposition with an argon gas pressure of 0.5 Pa, spacing between the target and the substrate at 80 mm, using non-alkali glass as the substrate, and, with the substrate in a non-heated state, and sputtering power of 785 W and deposition time of 22 seconds in order to obtain a film having a film thickness of approximately 550 Å. As a result of conducting XRD measurement of the foregoing film, a peak showing crystallinity could not be acknowledged.

Moreover, etching was performed by using a solution obtained by mixing oxalic acid and purified water at a ratio of oxalic acid:purified water=5:95 wt % as the etchant, but no etching residue was acknowledged.

Figure 1:
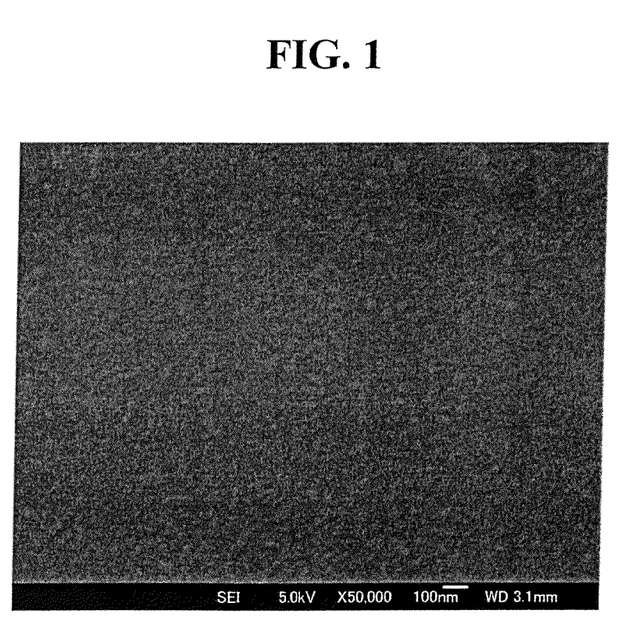
FIG. 1 is a diagram showing an electron micrograph of the film surface midway during the etching of the sputtered film of Example 1.

The electron micrograph of the film surface midway during the etching is shown in FIG. 1. Based on the results of the two types of evaluations for determining the film characteristics, the obtained film has been determined as amorphous.

The foregoing amorphous film was annealed under a nitrogen atmosphere at the respective temperatures of 100 to 210° C. for 60 minutes in 10° C. intervals, and the XRD measurement, resistivity, and transmission factor of the annealed film were measured.

Pursuant to the increase in the annealing temperature, the peak intensity in the XRD measurement gradually becomes larger, but the peak intensity suddenly increases from a certain temperature, and subsequently becomes stable. Moreover, pursuant to the increase in the annealing temperature, the film resistivity decreases, but the film resistivity suddenly decreases from a certain temperature, and subsequently becomes stable.

Both of the foregoing temperatures are roughly the same, and the temperature in which the peak intensity and resistivity start to stabilize was determined to be the crystallization temperature of the film. Since there is slight variance in determining whether the peak intensity and resistivity have stabilized in determining the crystallization temperature, variance of roughly 5° C. will arise. However, there is no need to strictly determine this value, and it will suffice to comprehend the tendency in relation to the additive concentration.

The crystallization temperature of this film was 177° C., and the resistivity of the crystallized film was 0.21 mΩcm. These results are shown in Table 1. Moreover, the transmission factor at a wavelength of 550 nm was 90%.

TABLE 1

| | Sintered Compact Composition (Atomicity Ratio %) | | | | | Crystallinity During Deposition | Temp. of Crystallization (° C.) | Resistivity after Crystallization (mΩcm) |
|---|---|---|---|---|---|---|---|---|
| | In | Sn | Ca | Mg | Zn | | | |
| Example 1 | 90.78 | 9.08 | 0.14 | 0.00 | 0.00 | amorphous | 177 | 0.21 |
| Example 2 | 90.66 | 9.07 | 0.27 | 0.00 | 0.00 | amorphous | 188 | 0.26 |
| Example 3 | 90.41 | 9.04 | 0.55 | 0.00 | 0.00 | amorphous | 206 | 0.28 |
| Example 4 | 89.91 | 8.99 | 1.10 | 0.00 | 0.00 | amorphous | 223 | 0.33 |
| Example 5 | 89.41 | 8.94 | 1.65 | 0.00 | 0.00 | amorphous | 238 | 0.37 |
| Example 6 | 89.09 | 8.91 | 2.00 | 0.00 | 0.00 | amorphous | 243 | 0.39 |
| Example 7 | 90.78 | 9.08 | 0.07 | 0.07 | 0.00 | amorphous | 183 | 0.22 |
| Example 8 | 90.66 | 9.07 | 0.135 | 0.135 | 0.00 | amorphous | 194 | 0.26 |
| Example 9 | 90.66 | 9.07 | 0.09 | 0.00 | 0.00 | amorphous | 197 | 0.27 |
| Example 10 | 90.66 | 9.07 | 0.18 | 0.18 | 0.00 | amorphous | 190 | 0.26 |
| Example 11 | 90.41 | 9.04 | 0.275 | 0.09 | 0.00 | amorphous | 212 | 0.29 |
| Example 12 | 89.91 | 8.99 | 0.55 | 0.275 | 0.00 | amorphous | 229 | 0.33 |
| Example 13 | 89.41 | 8.94 | 0.825 | 0.55 | 0.00 | amorphous | 243 | 0.36 |
| Example 14 | 89.09 | 8.91 | 1.00 | 0.825 | 0.00 | amorphous | 249 | 0.40 |
| Comparative Example 1 | 90.00 | 10.00 | 0.00 | 1.00 | 0.00 | crystalline | 150 | 0.18 |
| Comparative Example 2 | 90.00 | 0.00 | 0.00 | 0.00 | 10.00 | amorphous | 600 | 2.42 |
| Comparative Example 3 | 90.85 | 9.08 | 0.07 | 0.00 | 0.00 | crystalline | 155 | 0.20 |
| Comparative Example 4 | 88.64 | 8.86 | 2.50 | 0.00 | 0.00 | amorphous | 270 | 0.47 |

Examples 2 to 6

The sintered compact composition of Example 1 was changed as follows in Examples 2 to 6, whereby the other conditions are the same as Example 1.

The atomicity ratio % of the sintered compact composition in Example 2, 3, 4, 5 and 6 was changed to In:Sn:Ca=90.66:9.07:0.27, In:Sn:Ca=90.41:9.04:0.55, In:Sn:Ca=89.91:8.99:1.10, In:Sn:Ca=89.41:8.94:1.65, and In:Sn:Ca=89.09:8.91:2.00 respectively.

As a result of measuring the resistivity of the sputtering targets obtained as described above, the resistivity was in the range of 0.15 to 0.18 mΩcm. The crystallinity during deposition, the crystallization temperature, and the resistivity of the crystallized film were shown in Table 1, respectively.

From the foregoing results, the crystallinity of the deposited film was amorphous in all of the Examples, and, although the crystallization temperature gradually increases to a higher temperature pursuant to the increase in the calcium additive concentration, as evident from the results of Example 6, the crystallization temperature was 243° C., which is not too high.

Moreover, although the resistivity of the crystallized film gradually increases pursuant to the increase in the calcium additive concentration, as evident from the results of Example 6, the resistivity was 0.39 mΩcm, and this value remained smaller than 0.45 mΩcm, which is the resistivity of the amorphous film in which zinc was added to indium oxide in the case of Comparative Example 2 described later.

Examples 7 to 14

In substitute for adding calcium as in Examples 1 to 6, calcium and magnesium were added in Examples 7 to 14.

Here, the calcium concentration and the total of calcium and magnesium were made to coincide. Specifically, the calcium concentration of Example 7 and the total concentration of calcium and magnesium in Example 7 were made to be the same. Moreover, the calcium concentration of Example 2 and the total concentration of calcium and magnesium in Examples 8, 9, and 10 were made to be the same, respectively, and the concentration of calcium and magnesium in Examples 8, 9, and 10 was changed to 1:1, 1:2, and 2:1, respectively.

In addition, the calcium concentration and the total concentration of calcium and magnesium of Example 3 and Example 11, Example 4 and Example 12, Example 5 and Example 13, and Example 6 and Example 14 were made to be the same. Upon measuring the resistivity of the sputtering targets obtained as described above, the resistivity was in the range of 0.15 to 0.18 mΩcm. The crystallinity during deposition, the crystallization temperature, and the resistivity of the crystallized film were shown in Table 1, respectively.

From the foregoing results, the crystallinity of the deposited film was amorphous in all of the foregoing Examples, and the crystallization temperature gradually increases to a higher temperature pursuant to the increase in the total additive concentration of calcium and magnesium. The resistivity of the crystallized film was basically the same, although the crystallization temperature was approximately 6° C. higher in the case of adding both calcium and magnesium in comparison to the case of adding only calcium when the calcium concentration and the total concentration of calcium and magnesium were made to be the same.

Moreover, although the resistivity of the crystallized film gradually increases pursuant to the increase in the additive concentration of calcium and magnesium, as evident from the results of Example 14, the resistivity was 0.40 mΩcm, and this value remained smaller than 0.45 mΩcm, which is the resistivity of the amorphous film in that zinc was added to indium oxide in the case of Comparative Example 2 described later.

Comparative Examples 1 and 2

In Comparative Examples 1 and 2, as a sintered compact, a composition obtained by adding tin or zinc to indium oxide in the sintered compact of Example was used, whereby the other conditions are the same as the conditions of Example 1. The atomicity ratio % of the sintered compact composition in Comparative Example 1 and Comparative Example 2 is In:Sn=90.00:10.00, and In:Zn=90.00:10.00 respectively. The crystallinity during deposition, the crystallization temperature, and the resistivity of the crystallized film were shown in Table 1, respectively.

Figure 2:
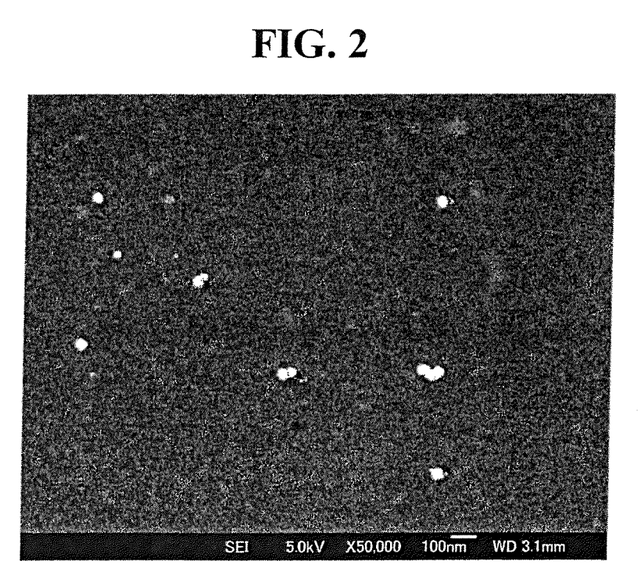
FIG. 2 is a diagram showing an electron micrograph of the film surface midway during the etching of the sputtered film of Comparative Example 1.

Moreover, the electron micrograph of the film surface during the etching of the film of Comparative Example 1 is shown in FIG. 2. A portion of the film crystallized as etching residue can be observed.

From the foregoing results, although the crystallization temperature is low and the resistivity of the crystallized film is small in Comparative Example 1, the film quality became crystallized during the deposition, which is a problem since this will remain as etching residue. Meanwhile, with Comparative Example 2, the quality of the deposited film was amorphous and the film resistivity was 0.45 mΩcm. Since the film was extremely stable as an amorphous material, the crystallization temperature resulted in extremely high at 600° C., and the resistivity of the crystallized film was extremely high at 2.42 mΩcm.

Comparative Examples 3 and 4

In comparative Examples 3 and 4, the sintered compact composition of Example 1 was changed as follows, whereby the other conditions are the same as the conditions of Example 1. The atomicity ratio % of the sintered compact composition in Comparative Example 3 and 4 was changed to In:Sn:Ca=90.85:9.08:0.07 and to In:Sn:Ca=88.64:8.86:2.50 respectively. Comparative Example 3 has a low calcium additive concentration and Comparative Example 4 has a high calcium additive concentration. The crystallinity during deposition, the crystallization temperature, and the resistivity of the crystallized film were as shown in Table 1, respectively.

From the foregoing results, the crystallization temperature is low and the resistivity of the crystallized film is small in Comparative Example 3, but the film quality became crystallized during the deposition, which is a problem since this will remain as etching residue.

Meanwhile, with Comparative Example 4, the quality of the deposited film was amorphous, but the crystallization temperature exceeded 260° C., which is very high and the resistivity of the crystallized film was high at 0.47 mΩcm.

Since this value is substantially the same as the resistivity of the film before annealing obtained by adding zinc to indium oxide in Comparative Example 2 described above, there is no particular advantage from the perspective of resistivity.

As explained above, according to the present invention, it is possible to obtain an ITO film in which the entire film is amorphous by subjecting the target to sputter deposition without adding water. In addition, the present invention is extremely useful as a transparent conductor with respect to the point that the film will subsequently crystallize by annealing at a temperature that is not too high, the etching rate of the film will decrease, and the resistivity of the film will become low.

We claim:

1. A composite oxide film comprising indium, tin, calcium and oxygen, wherein tin is contained at a ratio of 5 to 15% based on an atomicity ratio of Sn/(In+Sn+Ca) and calcium is contained at a ratio of 0.1 to 2.0% based on an atomicity ratio of Ca/(In+Sn+Ca), and remnant is indium and oxygen, wherein said composite oxide film is amorphous.

2. A composite oxide film according to claim 1, wherein the composite oxide film is of an amorphous state having a crystallization temperature of about 177° C. to about 249° C.

3. A method of producing a film of composite oxide, comprising the step of sputtering a sintered compact of composite oxide to produce an amorphous film comprising indium, tin, calcium and oxygen, wherein tin is contained at a ratio of 5 to 15% based on an atomicity ratio of Sn/(In+Sn+Ca) and calcium is contained at a ratio of 0.1 to 2.0% based on an atomicity ratio of Ca/(In+Sn+Ca), and remnant is indium and oxygen.

* * * * *